(12) United States Patent
Lu et al.

(10) Patent No.: US 12,256,574 B2
(45) Date of Patent: Mar. 18, 2025

(54) SINGLE-PHOTON AVALANCHE DIODE DEVICES WITH SHAPED JUNCTION REGIONS

(71) Applicant: SHENZHEN ADAPS PHOTONICS TECHNOLOGY CO., LTD., Shenzhen (CN)

(72) Inventors: Ching-Ying Lu, Shenzhen (CN); Yangsen Kang, San Jose, CA (US); Shuang Li, Shenzhen (CN)

(73) Assignee: SHENZHEN ADAPS PHOTONICS TECHNOLOGY CO., LTD., Shenzhen (CN)

( * ) Notice: Subject to any disclaimer, the term of this patent is extended or adjusted under 35 U.S.C. 154(b) by 465 days.

(21) Appl. No.: 17/584,346

(22) Filed: Jan. 25, 2022

(65) Prior Publication Data

US 2022/0149087 A1   May 12, 2022

(51) Int. Cl.
*H10F 39/00*  (2025.01)
*H10F 39/12*  (2025.01)
*H10F 39/18*  (2025.01)

(52) U.S. Cl.
CPC ....... *H10F 39/8033* (2025.01); *H10F 39/014* (2025.01); *H10F 39/184* (2025.01); *H10F 39/199* (2025.01); *H10F 39/8063* (2025.01); *H10F 39/807* (2025.01)

(58) Field of Classification Search
CPC ............. H01L 27/1461; H01L 27/1463; H01L 27/1464; H01L 27/14649; H10F 39/8033; H10F 39/807; H10F 39/199; H10F 39/184

See application file for complete search history.

(56) References Cited

U.S. PATENT DOCUMENTS

| 2021/0175380 A1* | 6/2021 | Borthakur | ........... H01L 27/1463 |
| 2021/0296377 A1* | 9/2021 | Lu | ........................ H01L 27/1461 |

FOREIGN PATENT DOCUMENTS

KR   20080101301 A   * 11/2008   ......... H01L 27/1461

\* cited by examiner

*Primary Examiner* — Peter M Albrecht

(57) ABSTRACT

The present invention is directed to electrical circuits. In a specific embodiment, the present invention provides a Single-Photon Avalanche Detector (SPAD) circuit that includes a junction region that is characterized by a wave-shaped profile that corresponds to a plurality of filling structures. The wave-shaped profile is associated with electric field and breakdown voltage uniformity. There are other embodiments as well.

14 Claims, 7 Drawing Sheets

SINGLE-PHOTON AVALANCHE DIODE DEVICES WITH SHAPED JUNCTION REGIONS

CROSS-REFERENCES TO RELATED APPLICATIONS

The present invention is related to U.S. patent application Ser. No. 17/033,052, entitled "IMAGE SENSING DEVICES WITH REFLECTOR ARRAYS", filed on Sep. 25, 2020, which is commonly owned and incorporated by reference herein for all purposes.

BACKGROUND OF THE INVENTION

The present invention relates generally to electric circuits.

Research and development in integrated microelectronics have continued to produce astounding progress with sensor devices. Many examples of photodiodes exist. For example, a photodiode is a p-n junction or PIN structure. When a photon of sufficient energy strikes the diode, it creates an electron-hole pair. This mechanism is also known as the inner photoelectric effect. If the absorption occurs in the junction's depletion region, or one diffusion length away from it, these carriers are swept from the junction by the built-in electric field of the depletion region. Thus, as holes move toward the anode (electrons move toward the cathode), a photocurrent is produced. The total current through the photodiode is the sum of the dark current (current that is generated in the absence of light) and the photocurrent, so the dark current must be minimized to maximize the sensitivity of the device.

Another example of a photodiode is called an "avalanche photodiode". The avalanche photodiodes are photodiodes with a structure optimized for operating with high reverse bias, approaching the reverse breakdown voltage. This allows each photo-generated carrier to be multiplied by avalanche breakdown, resulting in internal gain within the photodiode, which increases the effective sensitivity of the device. A type of photodiode—usually referred to as a single-photon avalanche diode (SPAD) device—has been gaining popularity and used in a variety of applications, such as LIDAR systems that have become a mainstream component of consumer electronics, automobiles, and other applications. Among other characteristics, uniformity of SPAD region electric field and the SPAD breakdown voltage are important aspects of SPAD devices, for the reasons explained below. Unfortunately, existing technology has been inadequate. Techniques for improving sensing devices are highly desired.

BRIEF SUMMARY OF THE INVENTION

The present invention is directed to electrical circuits. In a specific embodiment, the present invention provides a SPAD circuit that includes a junction region that is characterized by a wave-shaped profile that corresponds to a plurality of filling structures. The wave-shaped profile is associated with electric field and breakdown voltage uniformity. There are other embodiments as well.

According to various embodiment, a general aspect includes a single-photon avalanche diode (SPAD) image sensor that includes a first sidewall and a second sidewall. The SPAD image sensor also includes a silicon material configured between the first sidewall and the second sidewall. The silicon material may include a top region and a bottom region. The SPAD image sensor also includes an aperture region positioned at the top region. The SPAD image sensor also includes a plurality of fillings configured at the bottom region, the plurality of filling being arranged according to a first pattern. The SPAD image sensor also includes a first doped region configured within the silicon material. The first dope region may include a first boundary, the first boundary being characterized by the first wave shape corresponding to the first pattern. The SPAD image sensor also includes a second doped region configured within the silicon material, the second dope region may include a second boundary, the second boundary being characterized by second wave shape corresponding to the first pattern. The SPAD image sensor also includes a junction region configured between the first dope region and the second dope region, the junction region being characterized by a third wave shape corresponding to the first pattern.

Implementations may include one or more of the following features. The first sidewall of the SPAD image sensor may include a deep trench isolation structure. The SPAD image sensor may include a lens overlaying the aperture region. The plurality of filings may include shallow trench isolation structures. The plurality of fillings may include oxide material. The plurality of filings is characterized by a lower dopant penetration compared to the silicon material. The SPAD image sensor may include a lens overlaying the aperture region, the lens being configured to direct photons toward the junction region. The plurality of filings may include reflective surfaces for directing photons toward the junction region. The first sidewall may include a surface facing the second sidewall. The plurality of fillings may include a first filling and a second filling, the first filling being characterized by a width of about 150-700 nm, the first filling and the second filling sharing a spacing of about 400-900 nm. The width and the spacing are optimized for an electric field optimization at the junction region and for reflection optimization and reflecting photons to the junction region. The SPAD image sensor may include a pinning layer overlaying the plurality of fillings. The pinning layer may include p+ type material. The SPAD image sensor may include a passivation layer overlaying the plurality of filings.

One general aspect provides a backside illuminated (BSI) single-photon avalanche diode (SPAD) sensor device. The device includes a silicon material having a front side and a backside. The device also includes a first deep trench structure positioned within the silicon material. The device also includes a second deep trench structure positioned within the silicon material. The device also includes a plurality of fillings configured at the front side, the plurality of filling being arranged according to a predetermined pattern. The device also includes an n-type material having a first top region and a first bottom region, the first bottom region bordering the backside, the first top region may include a first sidewall and a second sidewall, the n-type material being characterized by a first width. The device also includes a p-type material having a second top region and a second bottom region, the second bottom region enclosing the first top region, the p-type material being characterized by a second width, the second width being greater than the first width. The backside also includes a junction region configured at an interface between the first top region and the second bottom region, the junction region being characterized by a wave shape corresponding to the predetermined pattern.

The device may include an n-type contact directly coupled to the n-type material and positioned within the first bottom region.

One general aspect includes a method for manufacturing a single-photon avalanche diode (SPAD) sensor. The method includes providing a silicon wafer, the silicon wafer being characterized by a first dopant penetration level. The method also includes forming a plurality of cavities according to a predetermined pattern. The method also includes filling the plurality of cavities with a filling material to form a plurality of fillings, the filling material being characterized by a second dopant penetration level, the second dopant penetration level being higher than the first dopant penetration level. The method also includes doping the silicon wafer at a first depth with a first dopant through the plurality of filings to form a first doped region. The method also includes doping the silicon wafer at a second depth with a second dopant through the plurality of fillings to form a second doped region. The method also includes forming a junction region between the first doped region and the second dope region, the junction region being characterized by a wave shape corresponding to the predetermined pattern.

In certain embodiments, the plurality of fillings may include shallow trench isolation structures.

It is to be appreciated that embodiments of the present invention provide many advantages over conventional techniques. Among other things, the wave-shaped profile of the SPAD region allows for uniform electric field and breakdown voltage. Additionally, operating lower breakdown voltage means SPAD sensors can achieve a high level of efficiency and better performance.

Embodiments of the present invention can be implemented in conjunction with existing systems and processes. For example, the wave-shaped SPAD regions can be manufactured in connection with standard STI formation processes. SPAD devices and systems according to embodiments of the present invention can be made to be compatible with existing systems (e.g., various types of lidar systems and techniques). There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention is directed to electrical circuits. In a specific embodiment, the present invention provides a SPAD circuit that includes a junction region that is characterized by a wave-shaped profile that corresponds to a plurality of filling structures. The wave-shaped profile is associated with electric field and breakdown voltage uniformity. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter-clockwise have been used for convenience purposes only and are not intended to imply any particular fixed direction. Instead, they are used to reflect relative locations and/or directions between various portions of an object.

Figure 1A:
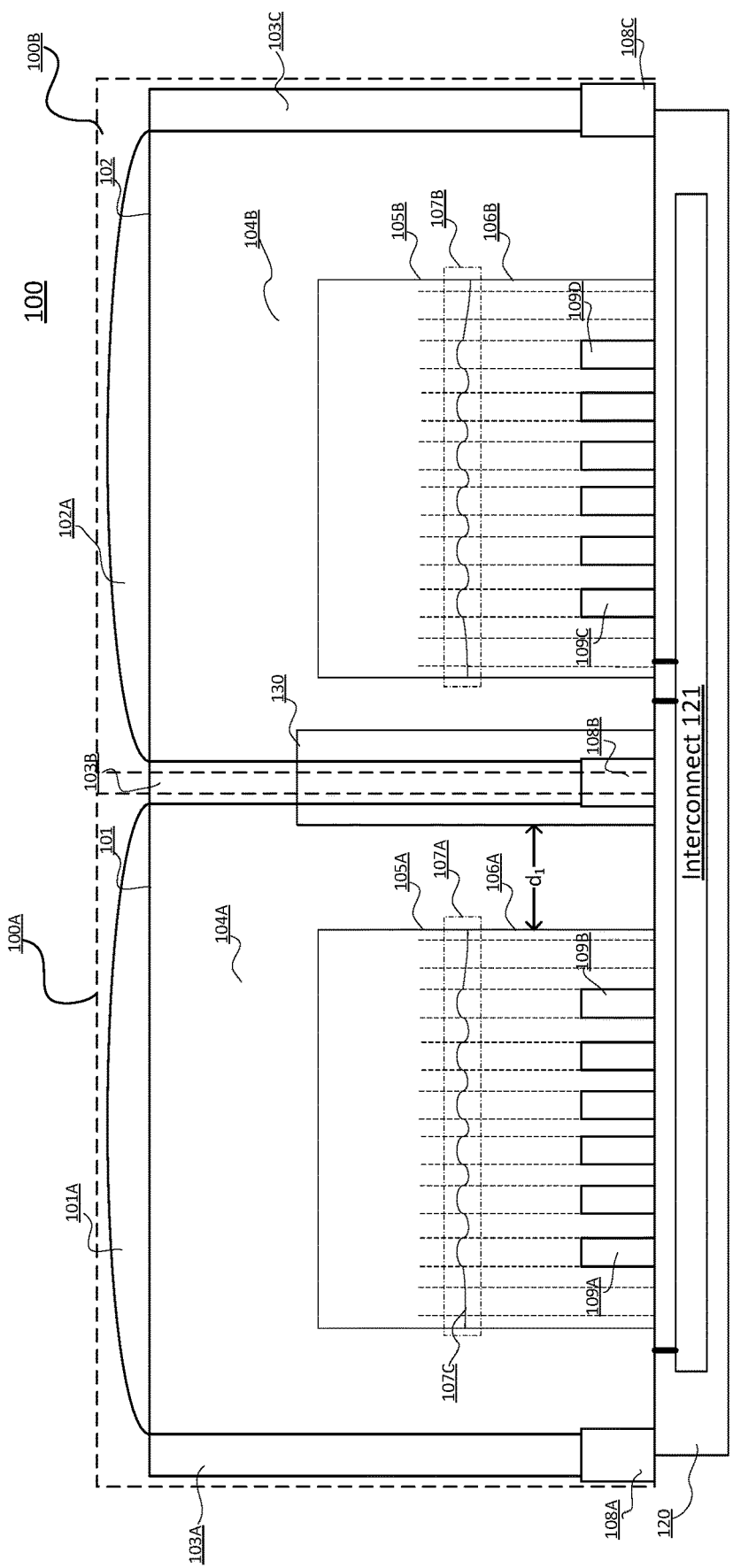
FIG. 1A is a simplified side view diagram illustrating SPAD array 100 according to an embodiment of the present invention.
Figure 1B:
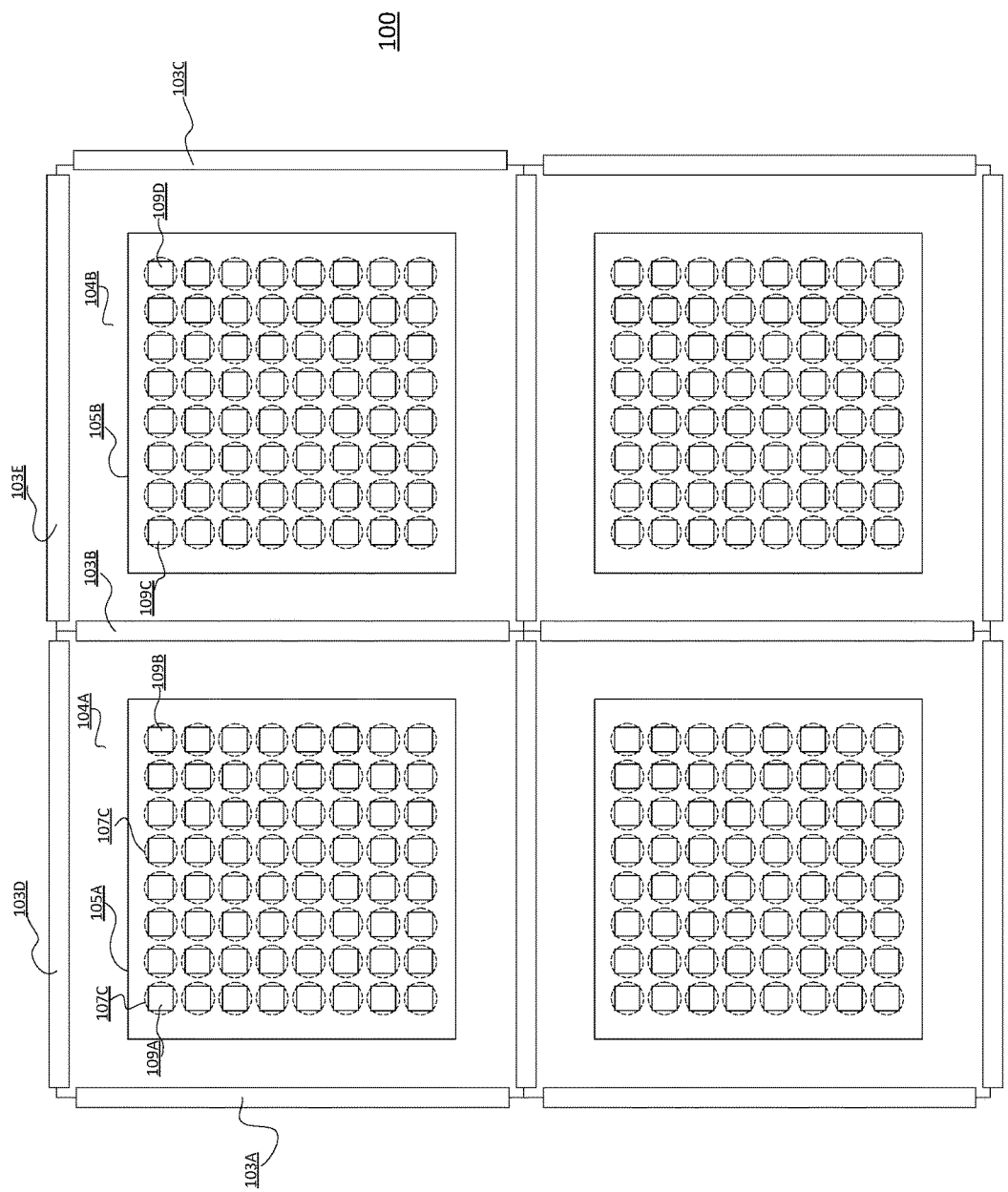
FIG. 1B is a simplified top diagram illustrating SPAD array 100 according to an embodiment of the present invention.

FIGS. 1A and 1B are simplified diagrams illustrating SPAD pixel array 100 according to embodiments of the present invention. These diagrams merely provide an example, which should not unduly limit the scope of the claims. In various embodiments, SPAD pixel array 100 includes a large number of SPAD pixels (usually over a thousand pixels), but two SPAD pixel devices (100A and 100B) are shown in FIG. 1A (and four in FIG. 1B) for illustration purposes. In various embodiments, SPAD pixel array 100 is fabricated according to back-side illumination (BSI) techniques, but other architectures—such as front-side illumination (FSI)—can be used as well. As an example, SPAD pixel array 100 is fabricated within silicon material (e.g., silicon material 104A and silicon material 104B). For example, silicon material 104A may be formed by an epitaxial growth process. As shown, a thickness of epitaxial material ranging from about 3 um to about 12 um is grown using a high-temperature growth technique, among others. In an example, epitaxial growth is made using chemical vapor deposition (CVD) process. In various embodiments, SPAD pixel array 100 may be configured on a semiconductor substrate that includes wiring and circuits for interconnecting many SPAD pixel devices. For example, p-contacts and n-contacts (not shown in FIG. 1A) are coupled to the interconnect 121. In various embodiments, interconnect 121 comprises a data bus for fast readout to generate depth mapping data, and the output of SPAD devices 100A and 100B are read in the same cycle.

As an example, the substrate may be a complementary metal-oxide silicon (CMOS) substrate, a blank or unpatterned substrate, a patterned, hybrid substrate, among others. In an example, the semiconductor substrate has a plurality of CMOS cells for logic circuitry, and can also include a plurality of memory cells, interface cells, and other circuit elements. As shown, the substrate has a bonding region and logic circuits, which can be configured as an output, quenching, recharge circuit, among others. Of course, there can be other variations, modifications, and alternatives.

As an example, in FIG. 1A, the top side of the silicon material is referred to as "the backside" and the bottom side of the silicon material is referred to as "the front side". The terms "front" and "back" refer to the front and back sides of a semiconductor wafer during the manufacturing process, during which various processes are performed on the front side of the wafer. A BSI SPAD refers to the side that light (e.g., photons) enters the SPAD device. Aperture regions 101 and 102 are respectively located on the backside of SPAD devices 100A and 100B. As described below, microlens or other types of optical structures (e.g., nanostructure, antireflection coating, color filter, bandpass filter, etc.) may be configured on the aperture regions. Microlens 101A overlays aperture region 101; microlens 102A overlays aperture region 102. Optical structures, such as microlens 101A and 102A, help guide incoming light and signal photons to the target region, which is the junction between the n-type material (106A and 106B) and p-type material (105A and 105B). The passivation layer (not shown) may be configured around the aperture region. In an example, a passivation layer may include an oxide material, a high-K dielectric material (e.g., $Al_2O_3$, $HfO_2$, $Ta_2O_5$, etc.), a nitride material ($Si_3N_4$, SiON, etc.), or a polyimide material, combinations thereof, and the like.

The SPAD pixel devices 100A and 100B are enclosed by isolation structures. SPAD pixel device 100A is enclosed by deep isolation structures 103A and 103B and shallow isolation structures 108A and 108B. SPAD pixel device 100B is enclosed by isolation structures 103C and 103B. In various embodiments, isolation structures comprise deep trench isolation (DTI) structures. In an embodiment, the DTI structure comprises a fill material, a surrounding charge material, and a surrounding insulating material. In an example, the fill material comprises a metal material, a semiconductor material, and/or an insulating material. For example, DTI structures may include composite material. In a preferred example, the fill material is tungsten. In an example, the surrounding charge material is $Al_2O_3$. Depending on the implementation, other materials may be as well. In an example, the surrounding insulating material includes an oxide or a nitride material, among others. In an example, the surrounding insulating material is $SiO_2$.

The isolation structures may additionally include p-well regions (not shown). In various embodiments, p-well regions are characterized by a p-type diffusion of boron. Depending on the implementation, other types of material may be used for the p-type diffusion as well. For example, p-well regions may be formed by implantation by multiple energy over an epitaxial growth base, rather than a substrate. Depending on the implementation, the isolation structures can be implemented with DTI structures and/or p-well regions. In some implementations, isolation structures may include only p-well regions and no DTI structures. In various embodiments, p-well regions may be formed by an implantation process, which may use multiple energies from a few hundred keV to a few MeV. The p-well regions could be through the entire epi thickness to provide passivation and isolation.

Shallow trench isolation structures 108A, 108B, and 108C are configured below the deep trench isolation. In an example, shallow trench isolation (STI) can include an oxide material as a filler. Depending on the implementation, the width and other dimensions of STI structures are configured relative to the location of n-type regions 106A and 106B. For example, STI structures are about same the width (i.e., about the same width or slightly wider) relative to DTI structures. In various embodiments, P-type contacts (or sometimes referred to as "P+" contacts) are configured at the bottom surface of silicon material 104A and 104B. N-type contacts (not shown) are coupled to the n-type regions 106A and 106B. For example, n-type contact and p-type contacts and may be configured using various types of implanted material (e.g., implanted conductive silicon).

N-type regions 106A and 106B, as shown, may include an n-well. For example, n-type region 106A may be referred to as "N-SPAD". N-SPAD may be formed by an implantation process, which could use multiple implantation energy levels. An important aspect of n-type material 106A is its dimensions, and in certain embodiments, the n-type region 106A is narrower than p-type region 105. The junction between p-type material 105A and n-type material 106A includes both the horizontal interface and the vertical interface as shown in FIG. 1A. More specifically, the bottom surface of p-type material 105A interfaces with the top surface of n-type material 106A. And because p-type material 105A is wider and encloses n-type material 106A, the top sidewalls of n-type material 106A also interface with p-type material 105A. Compared to conventional designs, the sidewall portions of the junction interfaces create a lateral electrical field and increase the total area for collecting the photon-generated carriers.

It is to be noted that N-SPAD 106A and P-SPAD 105A, fabricated using implantation processes, both have non-uniform doping concentrations. For example, p-type material 104 is formed by a first implantation process, and p-type material 105A is characterized by a radial concentration gradient around a center. In various embodiments, P-SPAD 105A is implanted at least 200 nm into the silicon from the front surface, which is to ensure that the avalanche region is away from the front surface and lowers the undesirable dark count rate (DCR). That is, carriers generated from the defects at the front surface would not travel to the avalanche region. In various embodiment, the P-SPAD 105A may have a concentration gradient from the avalanche region 107A toward the back surface. This creates a wider P-SPAD region and a higher electric field. This configuration shortens the carrier travel time from the epitaxial region to the avalanche region 107A and reduces jitter. For example, the concentration gradient in P-SPAD 105A may be generated by post-implantation anneal; the concentration gradient may also be generated by using multiple energies in implantation.

In various embodiments, the n-material 106A is also formed by an implantation process, and certain n-type dopants are implanted into a portion of p-type material. The n-type implantation is at least 1 μm (i.e., $d_1 > 1$ μm) laterally away from the p-well regions to avoid a direct carrier path from p-well regions to the n-type contact without passing through the avalanche region. The placement of the n-type material is also to avoid the avalanche region 107A extending from the desired junction area to the front surface.

For example, the implanted p-type material comprises a boron material having a concentration density of 1E15 atoms/cm3 to 1E18 atoms/cm3. For example, the implanted n-type material comprises a phosphorous entity or an arsenic entity having a concentration density of 1E17 atoms/cm3 to 1E19 atoms/cm3. Of course, there can be other variations, modifications, and alternatives. As shown, the implanted p-type material and the implanted n-type material are configured within a vicinity of the semiconductor substrate of the pixel element or near the bonding region.

The performance of a SPAD pixel device in large part is measured by its ability to collect—at the avalanche regions 107A and 107B positioned between the p-type regions (i.e., 105A and 105B) and n-type regions (i.e., 106A and 106B)—photon-generated carriers. For example, the term "avalanche region" refers to a region that is within a certain proximity of the junction defined by the interface between the p-type regions (105A and 105B) and the n-type regions (106A and 106B). In certain implementations, the p-type regions 105A and 105B as shown (may be referred to as "P-SPAD") include a retrograde p-well. For example, the P-SPAD may be formed by implantation processes (e.g., with one or more implantation energy). The p-type regions 105A and 105B, as implemented in various embodiments, are associated with a non-uniform doping concentration profile. For example, the doping concentration is the greatest near the active junction region at which the p-type region interfaces with the n-type region.

Electric field uniformity is an important performance metric of SPAD devices. In addition to electric field strength, uniformity across the avalanche region (i.e., 107A and 107B in FIG. 1A) is also important. Avalanche regions of conventional SPAD devices, unfortunately, usually have uneven electric fields that are stronger toward the edges. This type of uneven electric field greatly degrades the performance and reliability of SPAD devices.

Breakdown voltage is another important characteristic of SPAD devices. Both magnitude and uniformity of breakdown voltage ($V_{bd}$). As SPAD devices become more popular with portable devices, the trend is toward lower power consumption and higher pixel density. For most applications, low $V_{bd}$ translates to lower power consumption that facilitates—other factors being equal—the design of high pixel density, small device area, and less heat generation. Conventional SPAD devices often have poor $V_{bd}$ uniformity across their avalanche regions, as explained below and illustrated in FIG. 6.

Avalanche regions (or the junction regions between the p-type and n-type regions) according to embodiments of the present invention, are wave-shaped to improve electric field and breakdown voltage uniformity and reduce the breakdown voltage compared to convention SPAD devices. It is to be noted that the avalanche region's wave-shaped profile corresponds to the fillings below. While the side view (shown in FIG. 1A) of the SPAD array shows the wave-like pattern, the avalanche region in the three-dimension space comprises a plurality of "ripples".

The wave patterns of the avalanche regions 107A and 107B correspond to the fillings 109A-109B and 109C-109D, as illustrated by dashed lines. From the top view, as illustrated in FIG. 1B, the filings are configured as two-dimensional arrays, and the wave pattern (or ripples) of the avalanche regions correspond to the fillings. For example, the "crests" of the wave pattern correspond to the fillings, and the "troughs" of the wave pattern correspond to the space between the fillings. In various implementations, fillings 109A-109B—collectively—are narrower compared to the n-type region 106A, and the relative dimensions are selected to create the desired waveform 107C as shown.

Fillings 109A-109B and 109C-109D (including the fillings that are not labeled positioned between), in various embodiments, comprise oxide material. In various embodiments, these fillings are shallow trench isolation (STI) structures, which are formed by etching and deposition processes. For example, p-type region 105A and n-type region 106A are formed by implantation processes, where one or more doping materials penetrate silicon material 104A. During the implantation process, the doping material penetrates filling material 109A-D (e.g., oxide material) further than the silicon material 104A, and as a result, avalanche region 107A (also p-type region 105A and n-type region 106A) is formed with the wave pattern as shown. Because doping materials are implanted through the filling material, the filling material can be damaged. In order to reduce the damage and better passivate the silicon interface, one could remove implant-damaged oxide on top of the center STI; later, thermal oxidation and oxide deposition processes fill the etching openings. Positive charges can be introduced into the thermal oxide, which may help passivate the oxide-silicon interface.

In certain implementations, implantation of doping material is performed after the etching process, but before the deposition process, and the doping material penetrates deeper (compared to the doping material penetrating unetched silicon material) when passes through the etched openings. In such implementations, doping material penetrates deeper—as compared to doping through deposited material—the case and forms a wave pattern with a larger peak to peak value.

The fillings 109A-109B and 109C-109D are configured as light trapping structures. In various embodiments, SPAD array 100 is configured to capture infrared light, which tends to pass through the avalanche regions (mostly silicon material implanted with dopants) without being detected and absorbed. The light-trapping structures (i.e., fillings 109A-109B and 109C-109D) reflect infrared light back to the avalanche regions and prevent infrared light from escaping to adjacent SPAD pixels.

Figure 2:
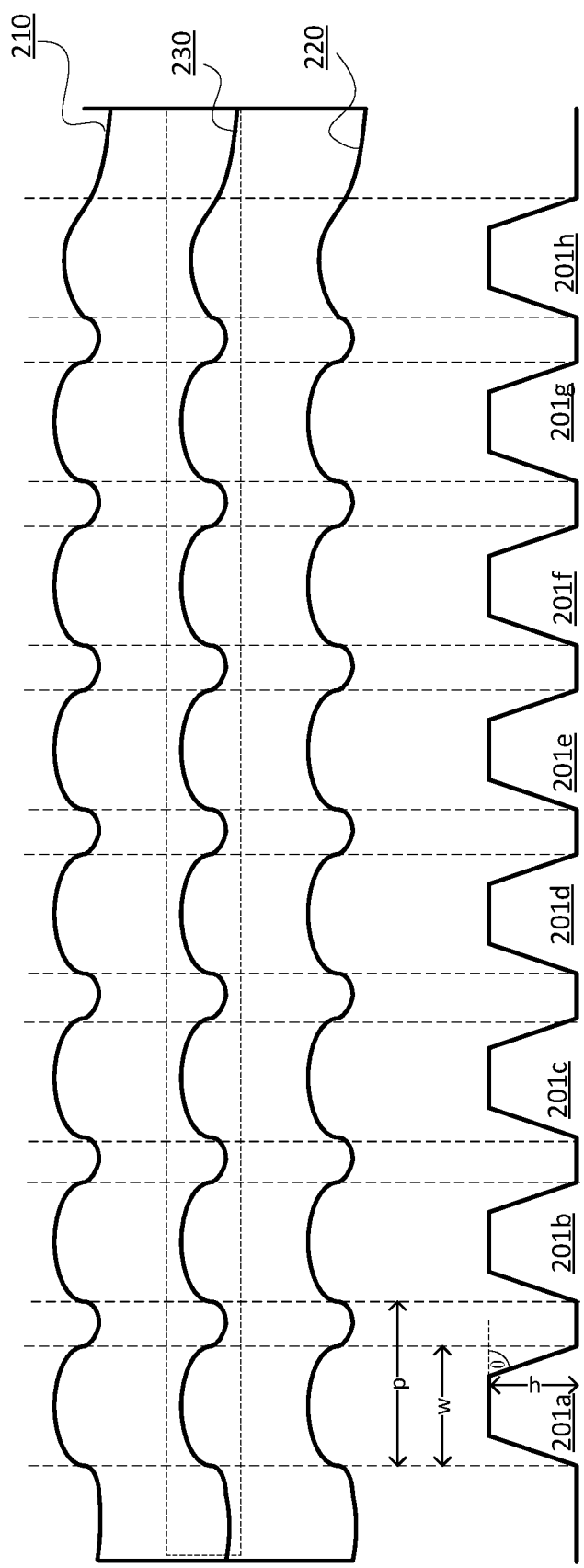
FIG. 2 is a simplified diagram illustrating a patterned SPAD region corresponding to a trapezoid filling pattern according to an embodiment of the present invention.

FIG. 2 is a simplified diagram illustrating a patterned SPAD region corresponding to a trapezoid filling pattern according to an embodiment of the present invention. This diagram is merely an example, which should not unduly limit the scope of the claims. One of ordinary skill in the art would recognize many variations, alternatives, and modifications. SPAD region 230 is positioned between a first doped region 210 and a second doped region 220. In certain embodiments, the first region 210 comprises a p-type region and the second region 220 comprises an n-type region, and region 210 and region 220 may include different doping materials or the same doping material at different concentrations. In some embodiments, the first region 210 comprises an n-type region and the second region 210 comprises a p-type region. The first region 210, SPAD region 230, and the second region 220 are characterized by a wave-shaped profile as shown. The wave-shaped profile corresponds to the fillings 201a-201h as shown. For example, fillings 201a-201h were created as STIs. In making STIs, openings are first etched according to a predetermined pattern, and then the openings are filled. Fillings 201a-201h as shown in FIG. 2 are substantially the same in size, shape, and distribution, but it is to be understood that other shapes and arrangements can be used as well.

In various implementations, the predetermined pattern is specifically designed to create the intended wave-shaped profile for SPAD region 230. For example, the width (i.e., label "w" above filling 201a) of each filling is about 150 to 700 nm, and the period (i.e., label "p" above filling 201a) is about 400 to 900 nm. Depending on the process, geometry, and distance from SPAD region 230, the filling's height (i.e., label "h" at filling 201a) can be configured at around 200-450 nm. In certain embodiment, the filling height can be over 600 nm (provided that fillings are not too close to the SPAD region 230). As shown in FIG. 2, the fillings are configured in a trapezoid shape, and the angle θ is about 73 to 83 degrees, depending on the implementations. For example, the trapezoid shape is optimized for both performance and manufacturing process. Compared to straight (i.e., at 90 degrees angle) sidewalls, fillings' angled sidewalls allow for gradual transitions of the SPAD region's wave-shaped profile. Additionally, the sidewall angle as shown allows for a more convenient etching and filling process compared to the straight sidewall angle.

As shown, the fillings correspond to the crests of the wave-shaped profile, while the spaces between the fillings correspond to the trough of the wave-shaped profile. The wave-shaped profile shares the same "period" as the filling pattern. For example, characteristics of SPAD region's wave-shaped pattern are optimized for infrared wavelength (i.e., about 780 nm to 1 mm, and in some embodiments between 900 nm to 950 nm).

The wave-shaped profile, as shown, is not limited to SPAD region 230. Region 210 and region 220 are also characterized by their own wave-shaped profiles that correspond to fillings 201a-201h, but it is to be noted that region 210 and region 220 do not share the same wave-shaped profile. That is because region 210 and region 220 have different dopants (or doping concentrations). While the wave-shaped profiles of region 210 and region 220 both attribute to the fillings 201a-201h, different dopants and/or doping processes produce different wave-shaped profiles.

The transition between the "crests" of the wave-shaped profiles transitions to the "troughs" depends on the geometry and pattern of the fillings. The sidewall angle θ as shown allows for a gradual transition between crests and troughs of the wave-shaped profile. Depending on the implementation, the sidewall angle θ is specifically selected based on height and width of the fillings to help produce the desired wave-shaped profile.

Fillings 201a-201h, according to various embodiments, also provide light trapping functions, as explained above. For example, top surfaces of fillings 201a-201h are reflective and they are configured to direct photons toward the SPAD region 230.

Figure 3:
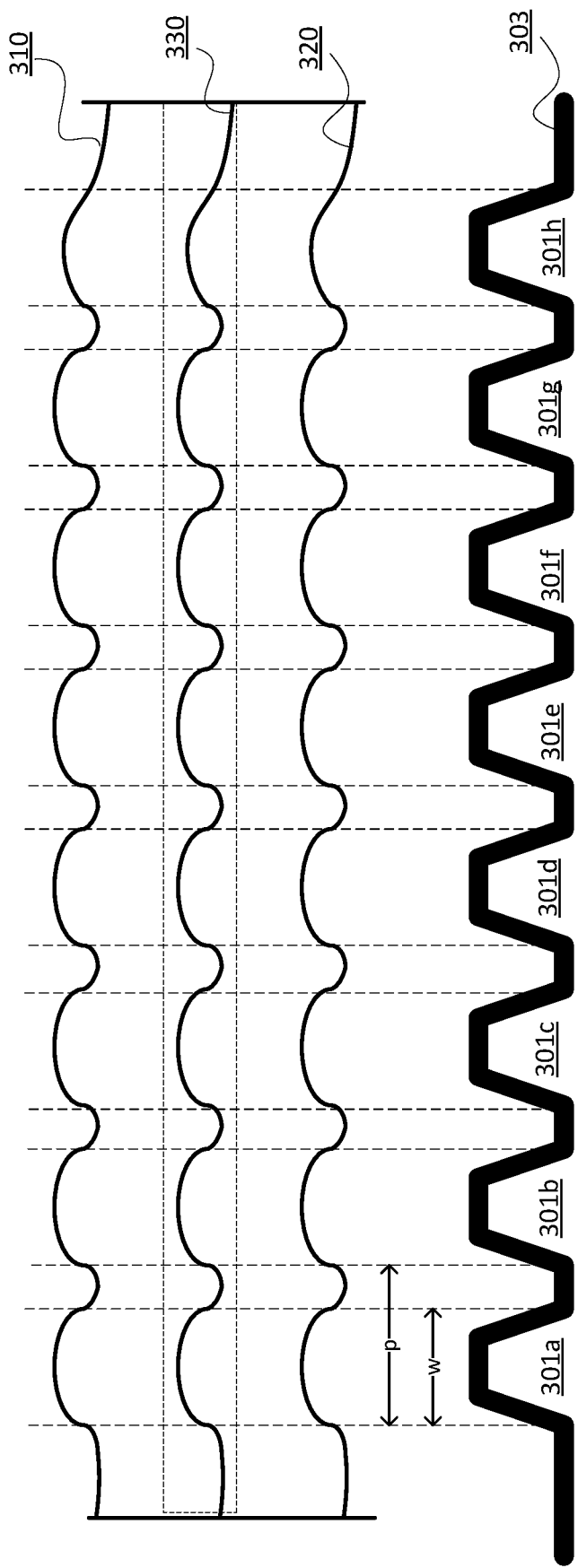
FIG. 3 is a simplified diagram illustrating a patterned SPAD region corresponding to a lined trapezoid filling pattern according to an embodiment of the present invention.

FIG. 3 is a simplified diagram illustrating a patterned SPAD region corresponding to a lined trapezoid filling pattern according to an embodiment of the present invention. This diagram is merely an example, which should not unduly limit the scope of the claims. One of ordinary skill in the art would recognize many variations, alternatives, and modifications. SPAD region 330 is configured between region 310 and region 320. For example, region 310 is a p-type region and region 320 is an n-type region. In certain embodiments, region 320 is a p-type region and region 310 is an n-type region. As described above, the n-type region and p-type region can be by implanting different doping materials and/or implanting a doping material at different doping concentrations. The wave-shaped profile of SPAD region 330 corresponds to fillings 301a-301h as shown. Fillings 301a-301h are characterized by a trapezoid shape. A pinning layer 303 overlays fillings 301a-h. For example, pinning layer 303 may be configured as a passivation layer that reduces undesirable DCR. In various implementations, pinning layer 303 comprises P+ type material. Pinning layer 303 may be formed in a self-aligned implantation process before the etched openings are filled with fillings 301a-301h. The top surface of the pinning layer 303 may be implanted at a later and separate step as well.

Figure 4:
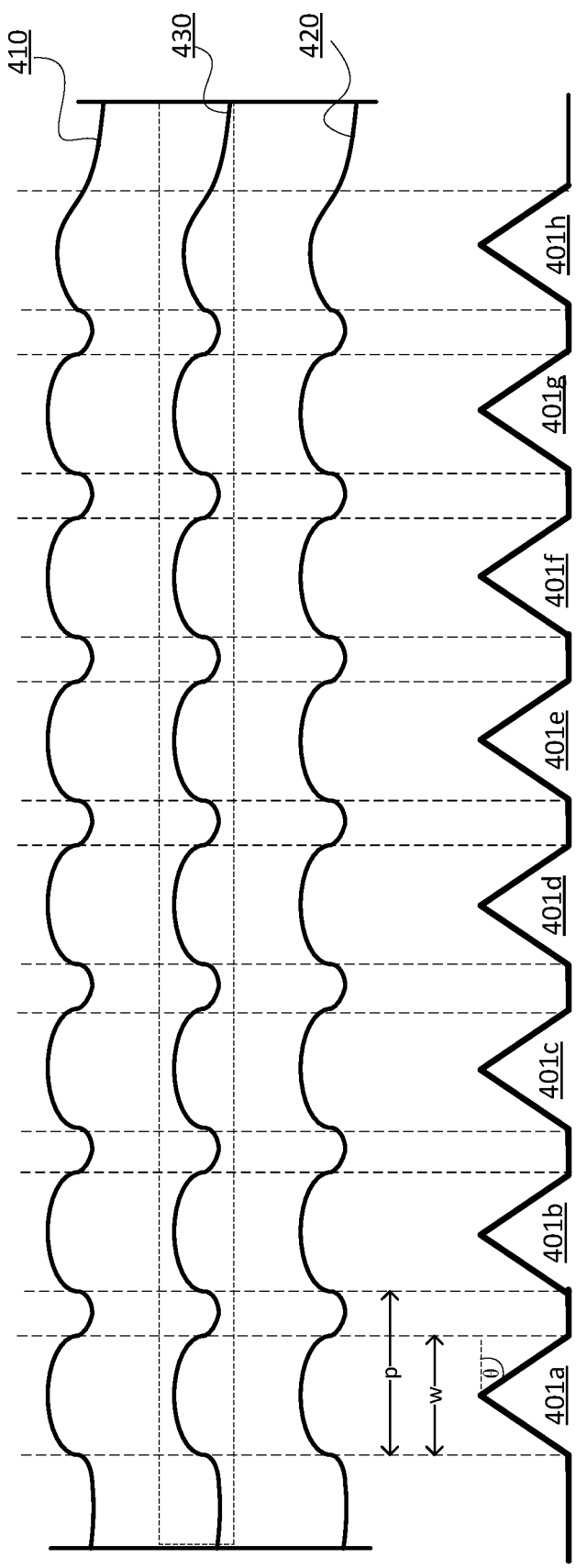
FIG. 4 is a simplified diagram illustrating a patterned SPAD region corresponding to a triangular filling pattern according to an embodiment of the present invention.

FIG. 4 is a simplified diagram illustrating a patterned SPAD region corresponding to a triangular filling pattern according to an embodiment of the present invention. This diagram is merely an example, which should not unduly limit the scope of the claims. One of ordinary skill in the art would recognize many variations, alternatives, and modifications. SPAD region 430 is configured between region 410 and region 420. For example, region 410 is p-type region and region 420 is an n-type region. In certain embodiments, region 420 is p-type region and region 410 is an n-type region. As described above, n-type region and p-type region can be by implanting different doping materials and/or implanting a doping material at different doping concentrations. The wave-shaped profile of SPAD region 430 corresponds to fillings 401a-401h as shown. Fillings 401a-401h are characterized by a substantially triangular-shaped from the side view in FIG. 4, but in three-dimensional form, fillings 401a-401h are substantially pyramidal-shaped. The triangular shape and the geometry of filings 401a-401h, in some implementations, allow for a continuous and wave-shaped profile for SPAD region 430. For example, the sidewall angle θ may be about 45-65 degrees. In contrast, fillings with straight sidewalls make it harder for dopants to reach the "crest" regions of the wave-shaped profile, resulting in a step-shaped profile instead. In some implementations, wave-shaped profiles may be preferable to step-shaped profiles, as they facilitate lower breakdown voltage and more consistent electric field and breakdown voltage. Depending on the implementation, shape, size, and uniformity of fillings 401a-401h may vary for optimized performance. For example, fillings 401a and 401h that are positioned on the peripheral regions may be shaped differently (e.g., shallower) compared to the filings 401d and 401e that are configured in the mid region.

Figure 5:
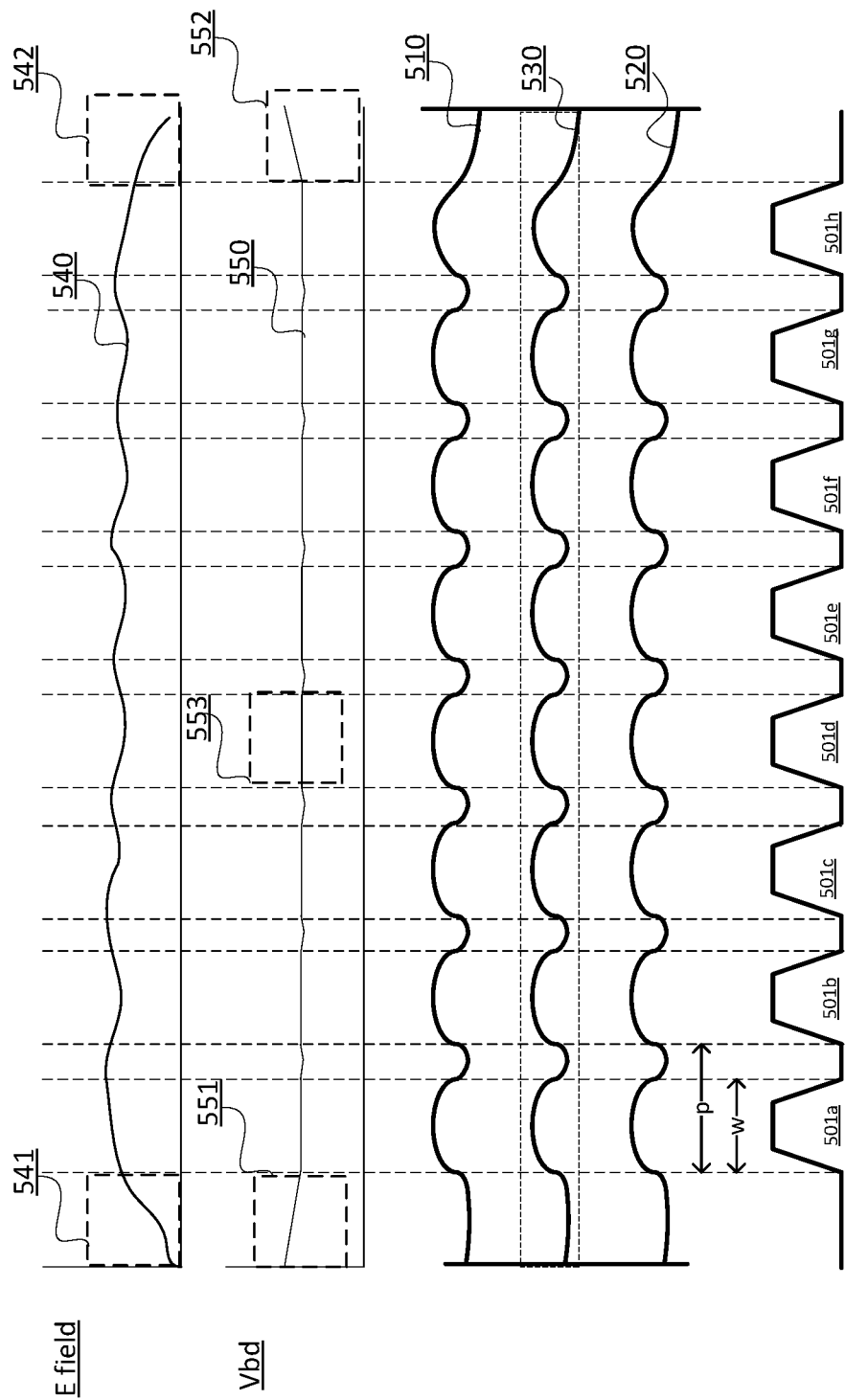
FIG. 5 is a simplified diagram illustrating the electric field and breakdown voltage of a shaped SPAD region according to embodiments of the present invention.

FIG. 5 is a simplified diagram illustrating the electric field and breakdown voltage of a shaped SPAD region according to embodiments of the present invention. This diagram is merely an example, which should not unduly limit the scope of the claims. One of ordinary skill in the art would recognize many variations, alternatives, and modifications.

The electric field curve 540 as shown is substantially even (or flat), and the slight variations of electric field strength roughly correspond to the wave-formed profile of SPAD region 530. As can be seen at regions 541 and 542 (corresponding to the edge region), the electric field curves are steep. The breakdown voltage curve 550 as shown is also substantially even due to the "ripples" of the waveform (except regions 551 and 552 near the edge of the SPAD region). The slight variations at the "ripples" are desirable, and they correspond to the crests and troughs of the wave-shaped profile of SPAD region 530. For example, electric field strength and breakdown voltage magnitude are related: the wave-shaped profile provides an even and "flattened" electric field that is inducive to avalanche, thereby lowing the breakdown voltage compared to convention SPAD devices. It is to be appreciated that electric field curve 540 and breakdown voltage curve 550 afford a high level of performance, as measured in reliability, consistency, power efficiency, and other metrics.

Figure 6:
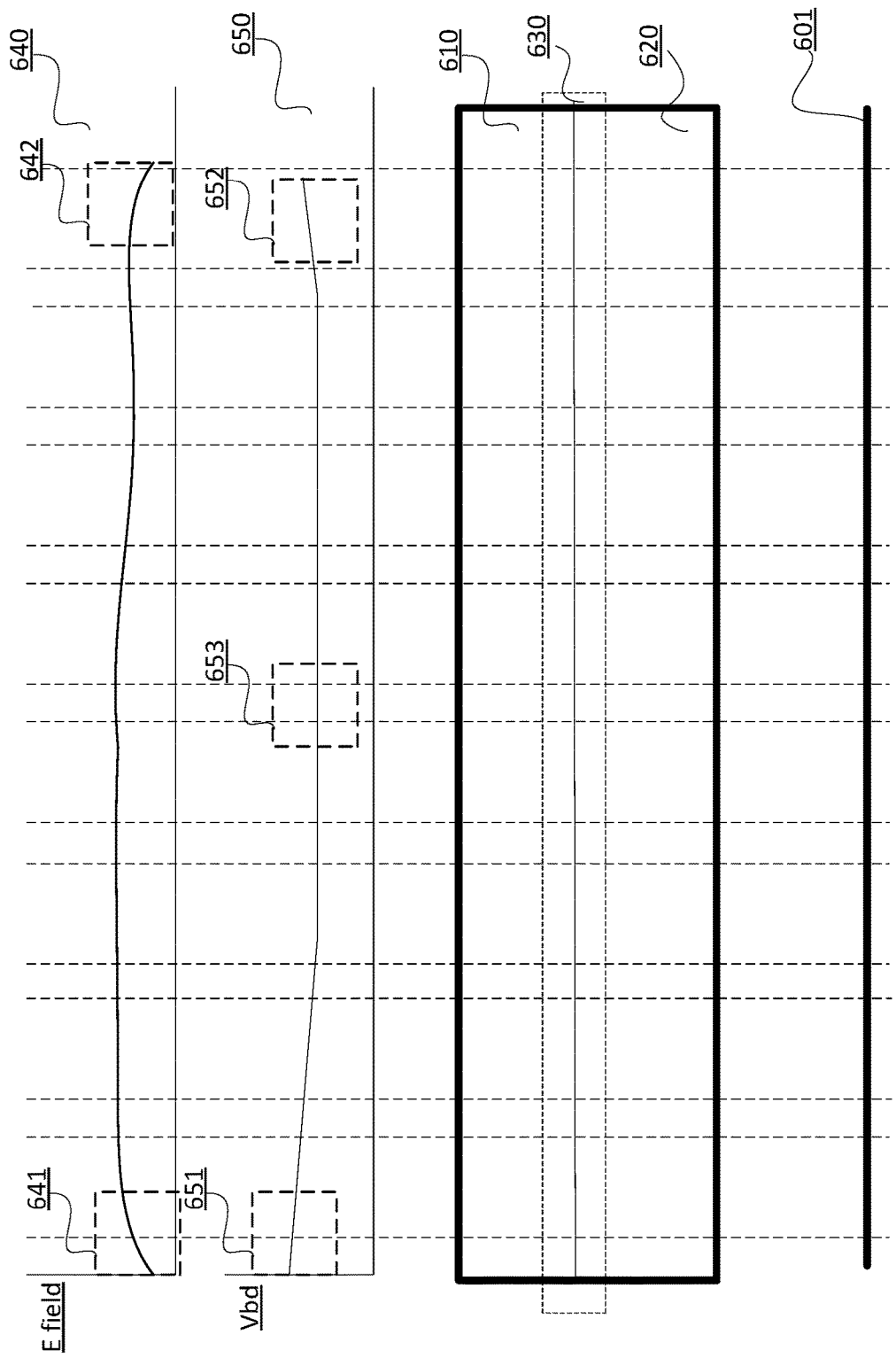
FIG. 6 is a simplified diagram illustrating the electric field and breakdown voltage of a conventional SPAD region for comparison.

FIG. 6 is a simplified diagram illustrating the electric field and breakdown voltage of a conventional SPAD region for comparison. SPAD region 630, as a junction between doped regions 610 and 620. Regions 610, 620, and 630, as shown in FIG. 6, are substantially flat, and there are no fillings at region 601. The 641 and 642 regions are characterized by a more gradual transition compared to regions 541 and 542 in FIG. 5. As a result, the breadown voltage Vbd at regions 651 and 652 is closer to the Vbd in the center region 653. When the edge Vbd is closer to the center Vbd, the overall Vbd is more likely to be affected by the edge. For a SPAD pixel, low Vbd region dominates, and it is desirable to make the edge Vbd much higher compared to the center. In FIG. 5, because electric field at regions 541 and 542 drops more rapidly, the corresponding Vbd respectively at regions 551 and 552 is substantially higher compared to the center region 553, where the Vbd has less effect on the overall SPAD Vbd level.

SPAD region 630 in FIG. 6 is shown to be substantially flat and even. But in actual implementation, conventional SPAD regions tend to have slight angle differences across the wafer, which is often cascaded with photoresist shadowing effect during the ion implantation steps. As a result, implant profiles across the wafer can vary and consistency suffers. This variation often causes breakdown voltage variations across the wafer, with one region having a higher breakdown voltage than the other. As shown in FIG. 6, breakdown curve 650 shows a higher breakdown voltage on the left side relative to the breakdown voltage on the right side. This angle variation mainly affects the doping profile near the edge of the active region. Adding STI to the center active region allows the center region to dominate in the avalanche process. Thus, it is not affected by the angle variations.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A single-photon avalanche diode (SPAD) image sensor, comprising:
   a first sidewall and a second sidewall;
   a silicon material configured between the first sidewall and the second sidewall, the silicon material comprising a top region and a bottom region;
   an aperture region positioned at the top region;
   a lens overlaying the aperture region;
   a plurality of fillings configured at the bottom region, the plurality of fillings being arranged according to a first pattern;
   a first doped region configured within the silicon material, the first doped region comprising a first boundary, the first boundary being characterized by a first wave shape corresponding to the first pattern;
   a second doped region configured within the silicon material, the second doped region comprising a second boundary, the second boundary being characterized by a second wave shape corresponding to the first pattern; and
   a junction region configured between the first doped region and the second doped region, the junction region being characterized by a third wave shape corresponding to the first pattern.

2. The SPAD image sensor of claim 1 wherein the first sidewall comprises a deep trench isolation structure.

3. The SPAD image sensor of claim 1 wherein the plurality of fillings comprises shallow trench isolation structures.

4. The SPAD image sensor of claim 1 wherein the plurality of fillings comprises oxide material.

5. The SPAD image sensor of claim 1 wherein the plurality of fillings is characterized by a greater dopant penetration compared to the silicon material.

6. The SPAD image sensor of claim 1 further comprising a lens overlaying the aperture region, the lens being configured to direct photons toward the junction region.

7. The SPAD image sensor of claim 1 wherein the first sidewall comprises tungsten material.

8. The SPAD image sensor of claim 1 wherein the plurality of fillings comprises a first filling and a second filling, the first filling being characterized by a width of about 150-700 nm, the first filling and the second filling sharing a spacing of about 400-900 nm.

9. The SPAD image sensor of claim 8 wherein the width and the spacing are optimized for an electric field optimization at the junction region and for a reflection optimization for reflecting photons to the junction region.

10. A single-photon avalanche diode (SPAD) image sensor, comprising:
    a first sidewall and a second sidewall;
    a silicon material configured between the first sidewall and the second sidewall, the silicon material comprising a top region and a bottom region;
    an aperture region positioned at the top region;
    a plurality of fillings configured at the bottom region, the plurality of fillings being arranged according to a first pattern;
    a pinning layer overlaying the plurality of fillings;
    a first doped region configured within the silicon material, the first doped region comprising a first boundary, the first boundary being characterized by a first wave shape corresponding to the first pattern;
    a second doped region configured within the silicon material, the second doped region comprising a second boundary, the second boundary being characterized by a second wave shape corresponding to the first pattern; and
    a junction region configured between the first doped region and the second doped region, the junction region being characterized by a third wave shape corresponding to the first pattern.

11. The SPAD image sensor of claim 10 wherein the pinning layer comprises p+ type material.

12. The SPAD image sensor of claim 1 further comprising a passivation layer overlaying the plurality of fillings.

13. A backside illuminated (BSI) single-photon avalanche diode (SPAD) sensor device comprising:
- a silicon material having a front side and a back side;
- a first deep trench structure positioned within the silicon material;
- a second deep trench structure positioned within the silicon material;
- a plurality of fillings configured at the front side, the plurality of fillings being arranged according to a predetermined pattern;
- an n-type material having a first top region and a first bottom region, the first bottom region bordering the front side, the first top region comprising a first sidewall and a second sidewall, the n-type material being characterized by a first width;
- a p-type material having a second top region and a second bottom region, the second bottom region enclosing the first top region, the p-type material being characterized by a second width, the second width being greater than the first width; and
- a junction region configured at an interface between the first top region and the second bottom region, the junction region being characterized by a wave shape corresponding to the predetermined pattern.

14. The BSI SPAD sensor device of claim 13 further comprising an n-type contact directly coupled to the n-type material and positioned within the first bottom region.

* * * * *